(12) United States Patent
Saito et al.

(10) Patent No.: US 11,437,267 B2
(45) Date of Patent: Sep. 6, 2022

(54) WORKPIECE UNIT INCLUDING ADHESIVE TAPE WITH COLOR CHANGE LAYER

(71) Applicant: DISCO CORPORATION, Tokyo (JP)

(72) Inventors: Yoshinobu Saito, Tokyo (JP); Masayuki Matsubara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 425 days.

(21) Appl. No.: 16/710,319

(22) Filed: Dec. 11, 2019

(65) Prior Publication Data

US 2020/0185254 A1    Jun. 11, 2020

(30) Foreign Application Priority Data

Dec. 11, 2018    (JP) .............................. JP2018-232028

(51) Int. Cl.
| | | |
|---|---|---|
| *H01L 21/683* | (2006.01) | |
| *H01L 21/67* | (2006.01) | |
| *H01L 21/78* | (2006.01) | |
| *G02F 1/01* | (2006.01) | |

(52) U.S. Cl.
CPC .... *H01L 21/6836* (2013.01); *H01L 21/67248* (2013.01); *G02F 1/0147* (2013.01); *H01L 2221/68327* (2013.01)

(58) Field of Classification Search
CPC ............. H01L 21/6835; H01L 21/6836; H01L 21/67132; H01L 22/10; H01L 22/12; H01L 22/30; H01L 21/67248; H01L 2221/68327; H01L 2221/68336; H01L 21/78; G02F 1/0147; C09J 2301/30; C09J 2301/304

See application file for complete search history.

(56) References Cited

U.S. PATENT DOCUMENTS 6,421,456 B1 * 7/2002 Son ........................ H01L 23/544
257/E23.179

FOREIGN PATENT DOCUMENTS

JP            2006049591 A      2/2006
WO    WO-2004113464 A1 * 12/2004   ........... B32B 27/065

* cited by examiner

*Primary Examiner* — Sonya McCall-Shepard
(74) *Attorney, Agent, or Firm* — Greer, Burns & Crain, Ltd.

(57) ABSTRACT

A workpiece unit includes a wafer, a tape attached to the wafer, and an annular frame to which an outer peripheral edge of the tape is attached and having an opening in a center of the annular frame, and the workpiece unit has the wafer positioned in the opening of the annular frame through the tape. In the workpiece unit, the tape has a color change layer that reversibly changes in color in response to a change in temperature caused by cooling.

6 Claims, 4 Drawing Sheets

WORKPIECE UNIT INCLUDING ADHESIVE TAPE WITH COLOR CHANGE LAYER

BACKGROUND OF THE INVENTION

Field of the Invention

The present invention relates to a workpiece unit that includes a workpiece, a tape attached to the workpiece, and an annular frame having an opening in the center thereof and to which an outer peripheral edge of the tape is attached.

Description of the Related Art

A generally known workpiece unit includes a plate-shaped workpiece such as a semiconductor wafer, a tape, and an annular frame. Specifically, the tape is attached to the workpiece. An outer peripheral edge of the tape is attached to the annular frame. The annular frame has an opening in the center thereof. The workpiece unit of this type may include ductile elements such as a test element group (TEG) provided on planned division lines of the workpiece or a die attach film (DAF) attached between the workpiece and the tape. In a proposed technology (e.g., Japanese Patent Laid-Open No. 2006-049591), when the tape is expanded to divide the workpiece together with the ductile elements, the workpiece unit is cooled (exposed to an external stimulus) to decrease the ductility of the ductile elements. Accordingly, the workpiece is divided efficiently.

SUMMARY OF THE INVENTION

However, since it is not possible to determine, from an appearance of the tape, whether or not cooling is sufficient, in a case in which the tape is expanded in a state in which cooling is not sufficient, the ductile elements may be stretched out and cannot be divided. Moreover, once the tape is expanded, the tape is stretched out. The stretched-out tape cannot be sufficiently expanded any more. Therefore, it is not possible to divide the ductile elements even if the workpiece unit is cooled again.

It is, therefore, an object of the present invention to provide a workpiece unit that allows a worker to determine, from an appearance of a tape, whether a process involving an external stimulus has been performed.

In accordance with an aspect of the present invention, there is provided a workpiece unit including a workpiece, a tape that is attached to the workpiece, and an annular frame to which an outer peripheral edge of the tape is attached and having an opening in a center of the annular frame, and the workpiece unit has the workpiece positioned in the opening of the annular frame through the tape. In the workpiece unit, the tape reversibly changes in color in response to an external stimulus.

With this configuration, since the tape changes in color in response to the external stimulus, a worker can easily determine, from the appearance of the tape, whether or not a process involving the external stimulus has been performed. This configuration can, therefore, prevent a failure that would otherwise be generated by causing the workpiece that has not been processed yet to be loaded to a subsequent process.

Preferably, the external stimulus includes a change in temperature.

Preferably, the tape changes in color to a first color at a first temperature and changes in color to a second color different from the first color at a second temperature different from the first temperature.

With the workpiece unit according to the present invention, since the tape changes in color in response to an external stimulus, a worker can easily determine, from the appearance of the tape, whether or not the process involving the external stimulus has been performed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Hereinafter, an embodiment of the present invention will be described in detail with reference to the drawings. The present invention is not limited to the embodiment described below. The components used in the embodiment below may include those that can be easily assumed by persons skilled in the art or substantially the same as those known in the art. Moreover, the configurations described below may be suitably combined with each other. Further, the configurations may be omitted, replaced, or changed in various manners without departing from the scope of the present invention.

Figure 1:
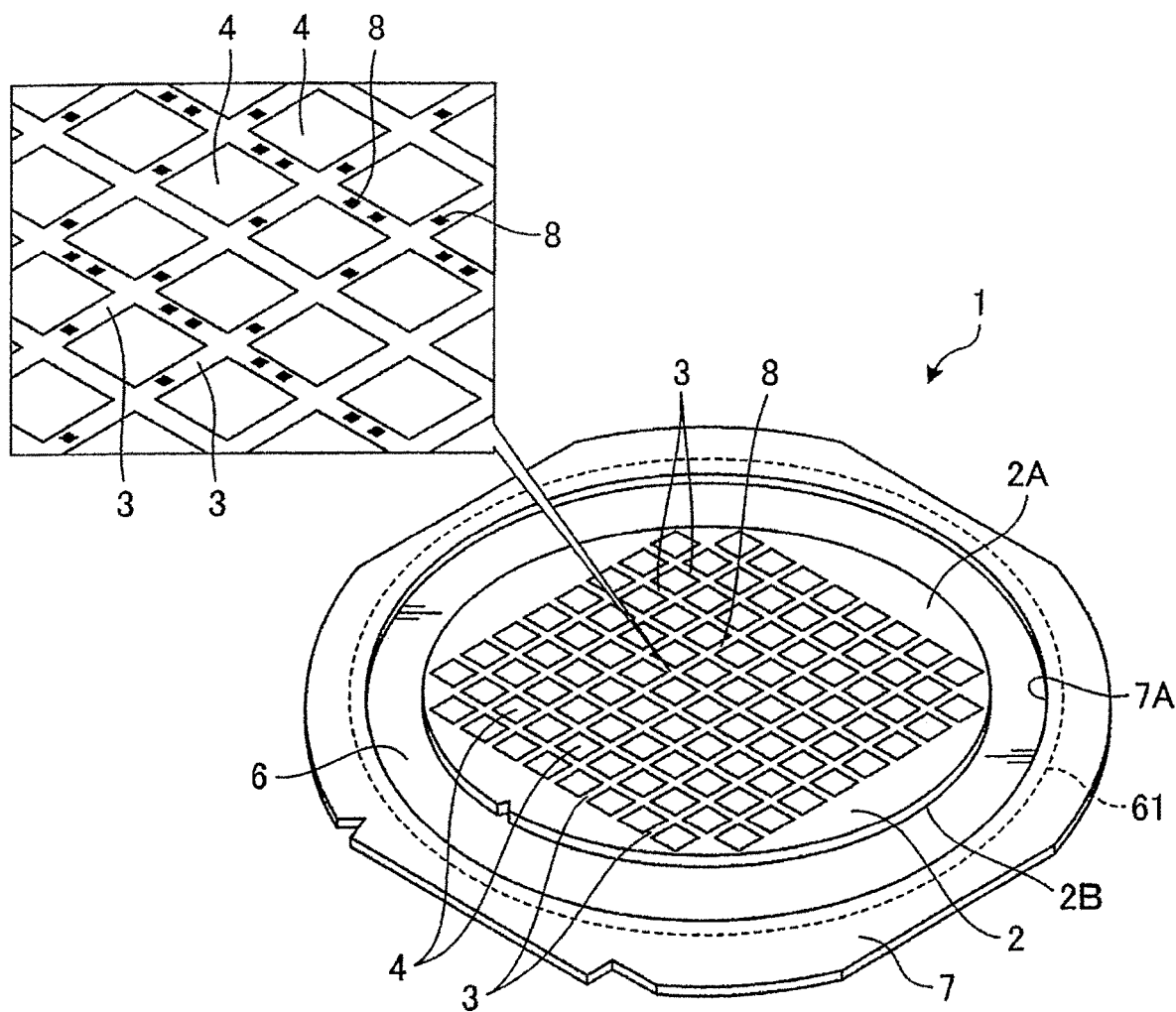
FIG. 1 is a perspective view illustrating an example of a configuration of a workpiece unit according to an embodiment of the present invention.
Figure 2:
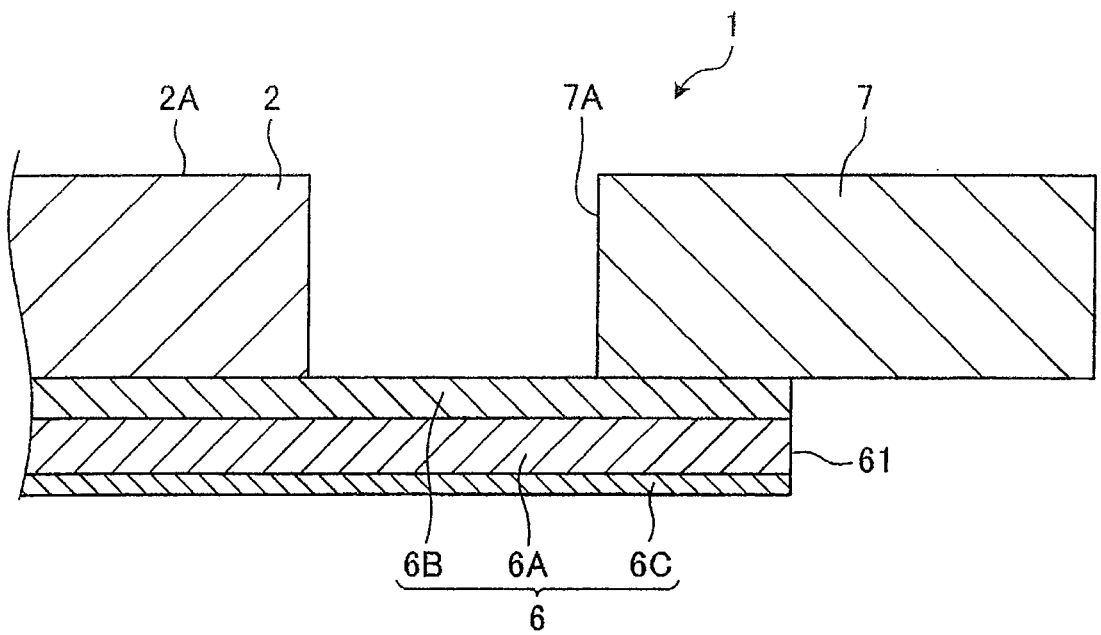
FIG. 2 is a cross-sectional view of part of the workpiece unit.

FIG. 1 is a perspective view illustrating an example of a configuration of a workpiece unit according to the present embodiment. FIG. 2 is a cross-sectional view of part of the workpiece unit. As illustrated in FIG. 1, a workpiece unit 1 includes a wafer 2, a tape 6, and an annular frame 7. The wafer 2 is a workpiece. The tape 6 is attached to the wafer 2. An outer peripheral edge 61 of the tape 6 is attached to the annular frame 7. The annular frame 7 has an opening 7A in the center thereof. The opening 7A of the annular frame 7 has a larger diameter than the wafer 2. The wafer 2 is positioned in the opening 7A and held through the tape 6 by the annular frame 7.

The wafer 2 is a disk-shaped semiconductor wafer using silicon as a base material, or an optical device wafer using sapphire, silicon carbide (SiC), or the like as a base material. In the wafer 2, a plurality of devices 4 are individually formed in a plurality of regions defined by grid-like planned division lines (planned cutting lines) 3 formed on a front surface 2A. Moreover, a ductile test element group (TEG) 8 is formed on the planned division lines 3. The TEG 8 is formed of a ductile metal or the like and is a group of test patterns for finding a design and manufacturing problem of the devices 4. The TEG 8 is provided at predetermined positions on the planned division lines 3 of the wafer 2. Although the disc-shaped wafer is described as the workpiece in the present embodiment, the workpiece is not limited to the wafer. The workpiece may be, for example, a package substrate, a ceramic substrate, or a glass substrate, which is formed in a rectangular plate shape.

As illustrated in FIG. 2, the tape 6 is, for example, an expansion tape and includes a base material 6A, an adhesive layer (glue layer) 6B, and a color change layer (color change portion) 6C. The base material 6A is made of synthetic resin having elasticity. The adhesive layer 6B is stacked on an upper surface of the base material 6A. The color change layer 6C is stacked on a lower surface of the base material 6A. The tape 6 is attached to a back surface 2B of the wafer 2 with the adhesive layer 6B serving as an upper surface. The color change layer 6C according to the present embodiment includes first thermochromic ink and second thermochromic ink, for example. In response to a change in temperature caused by cooling (external stimulus), the first thermochromic ink changes in color from colorless to a first color at a predetermined first temperature (e.g., 0° C.) or lower, while the second thermochromic ink changes in color from colorless to a second color different from the first color at a predetermined second temperature (e.g., −100° C.) or lower. The second temperature is lower (different from) than the first temperature. The first thermochromic ink and the second thermochromic ink are dispersed over the whole area of the color change layer 6C. The color change of each of the first thermochromic ink and the second thermochromic ink is reversible. Each of the first thermochromic ink and the second thermochromic ink can change in color according to the temperature of the tape 6 (workpiece unit 1). With this configuration, a worker can easily determine, from an appearance of the tape 6, an approximate cooling temperature of the workpiece unit 1 by checking whether the color change layer 6C has changed in color to the first color or the second color (including the color mixed with the first color). In the present embodiment, each of the first thermochromic ink and the second thermochromic ink changes in color from colorless to the corresponding color when the temperature has changed to the corresponding predetermined temperature or lower. However, as long as the color after the color change is known in advance, each of the first thermochromic ink and the second thermochromic ink may change in color from a color to a different color.

Figure 3:
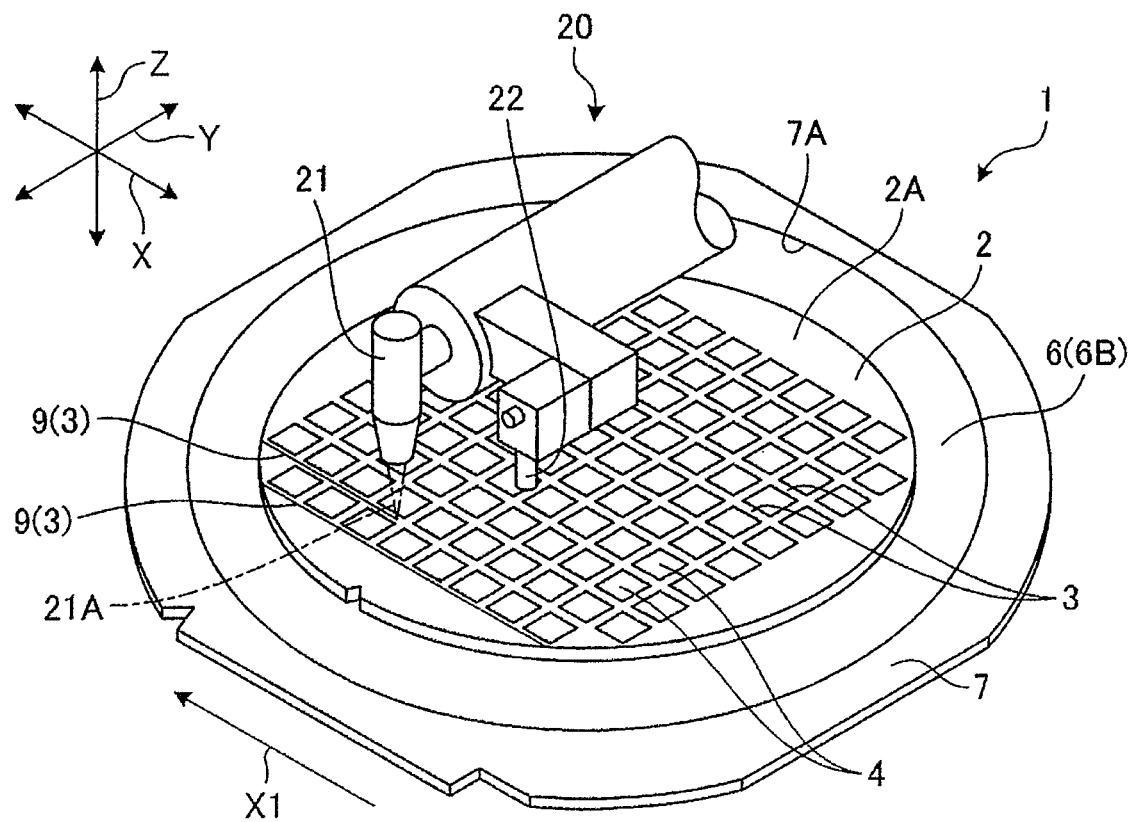
FIG. 3 is a perspective view illustrating a step of forming modified layers along planned division lines of a wafer of the workpiece unit.
Figure 4:
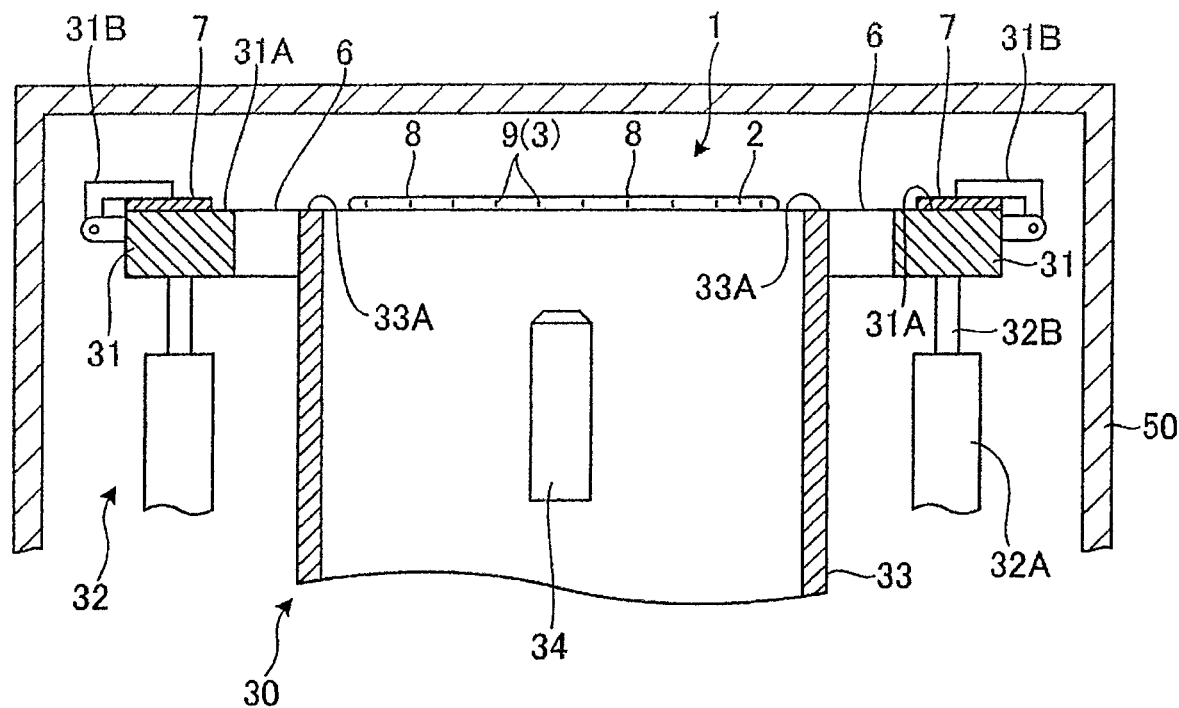
FIG. 4 is a cross-sectional view illustrating a state before the wafer is divided under a cooling condition.
Figure 5:
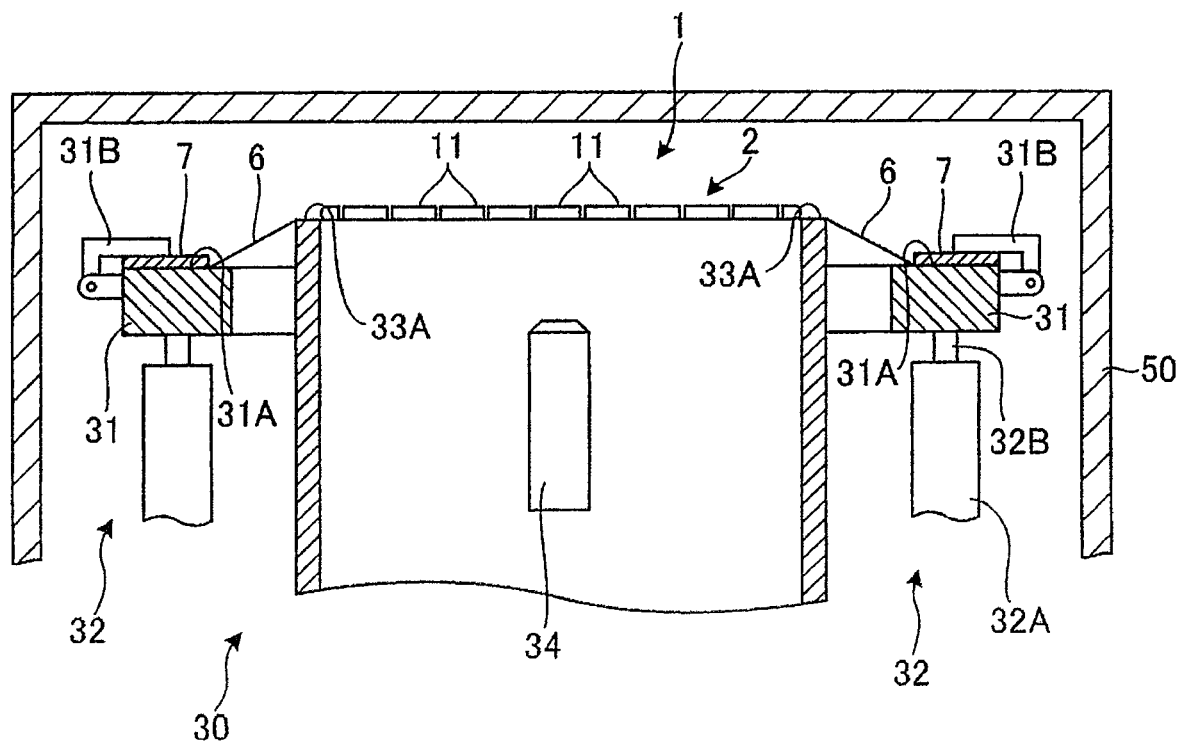
FIG. 5 is a cross-sectional view illustrating a state after the wafer is divided under the cooling condition.
Figure 6:
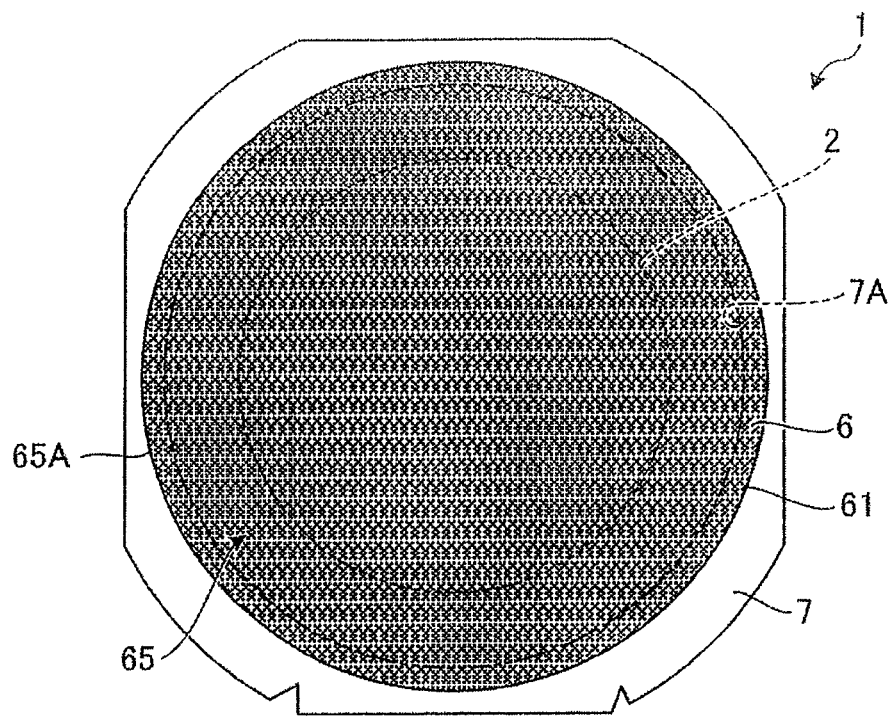
FIG. 6 is a bottom view of the workpiece unit with a tape sufficiently cooled.
Figure 7:
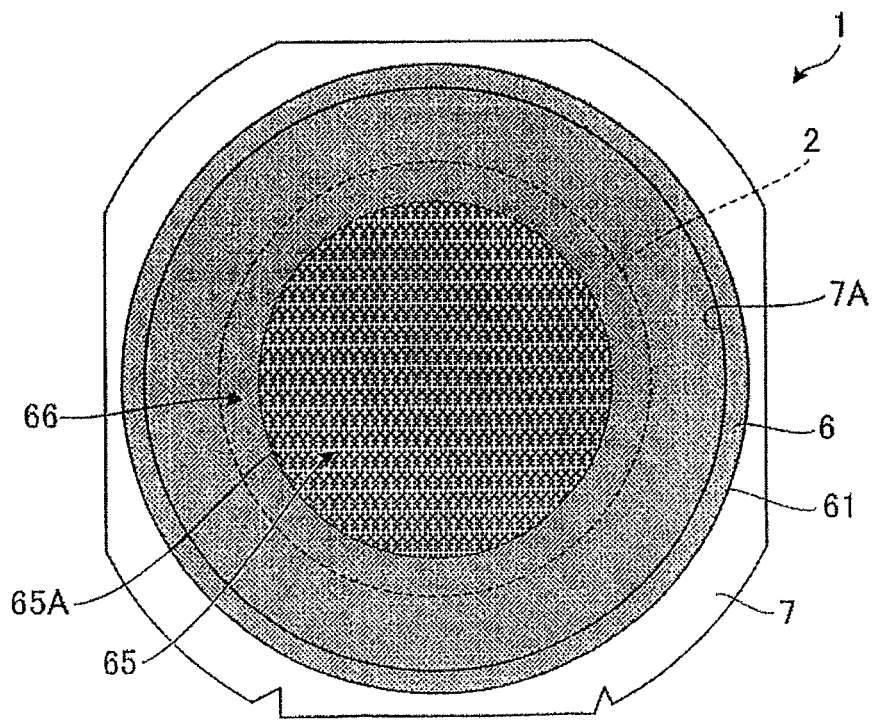
FIG. 7 is a bottom view of the workpiece unit with the tape not sufficiently cooled.

Next, a procedure for processing the workpiece unit 1 will be described. In the workpiece unit 1, the wafer 2 is supported by the annular frame 7 through the tape 6 including the color change layer 6C. In the present embodiment, with the workpiece unit 1 cooled, the tape 6 is expanded (cool expansion processing) to divide the wafer 2 into device chips. FIG. 3 illustrates a process of forming modified layers 9 along the planned division lines 3 of the wafer 2 of the workpiece unit 1. FIG. 4 illustrates a state before the wafer 2 is divided under a cooling condition. FIG. 5 illustrates a state after the wafer 2 is divided under the cooling condition. FIG. 6 is a bottom view of the workpiece unit 1 with the tape 6 sufficiently cooled. FIG. 7 is a bottom view of the workpiece unit 1 with the tape 6 not sufficiently cooled.

A laser processing apparatus 20 illustrated in FIG. 3 forms, inside the wafer 2, the modified layers 9 along the respective planned division lines 3. The modified layers 9 refer to altered regions in which a density, a refractive index, a mechanical strength, or other physical characteristics are different from those of the surroundings. Examples of the modified layers 9 include melting treatment regions, crack regions, dielectric breakdown regions, refractive index changing regions, and regions mixed with these regions. The laser processing apparatus 20 includes an irradiation head 21 and an imaging unit 22. The irradiation head 21 emits a laser beam 21A toward the wafer 2. The imaging unit 22 is provided side by side with the irradiation head 21 in an X direction. The irradiation head 21 includes a laser oscillator, not illustrated, and a condenser, not illustrated. The laser oscillator oscillates a laser of a wavelength that is transmittable through the wafer 2. The condenser focuses the laser beam emitted by the laser oscillator. The irradiation head 21 adjusts a condensing position (focus position) of the laser beam 21A, which is to be emitted toward the wafer 2, in a Z direction (vertical direction). The imaging unit 22 is a camera that images, for example, the arrangement of the wafer 2 relative to the irradiation head 21 and a processing state of the wafer 2.

The workpiece unit 1 is held by a chuck table, not illustrated. The chuck table is movable in the X direction. The chuck table is also rotatable about an axis parallel to the vertical direction. In the present embodiment, the chuck table holding the workpiece unit 1 moves in the X direction. However, as long as the laser processing apparatus 20 moves relative to the workpiece unit 1 in the X direction, the laser processing apparatus 20 may move in the X direction.

To form the modified layer 9 inside the wafer 2, the laser processing apparatus 20 images the front surface 2A of the wafer 2 using the imaging unit 22 to find a position of a predetermined one of the planned division lines 3. After that, the laser processing apparatus 20 determines the inside of the wafer 2 as the condensing position of the laser beam 21A, which is focused by the condenser. Then, the laser processing apparatus 20 emits the laser beam 21A along the corresponding planned division line 3 of the wafer 2 while the chuck table is moved for processing in an X1 direction. As a result, the modified layer 9 is formed inside the wafer 2 along the corresponding planned division line 3. Alternatively, a plurality (e.g., three) of modified layers 9 may be formed in a thickness direction of the wafer 2 along one planned division line 3. When the modified layers 9 are formed along all the planned division lines 3, the process of forming the modified layers 9 ends.

Next, an expansion apparatus 30 illustrated in FIG. 4 expands the tape 6 to divide the wafer 2 along the planned division lines 3. The expansion apparatus 30 according to the present embodiment is provided inside a cooling chamber 50 and expands the tape 6 (cool expansion processing) with the workpiece unit 1 cooled. The cooling chamber 50 includes a cool air supply port, not illustrated, and is capable of cooling the inside of the cooling chamber 50 to a desired temperature by supplying cool air from the cool air supply port.

The expansion apparatus 30 includes a frame holding table 31, an elevation unit 32, a tape expansion drum 33, and an imaging unit 34. The frame holding table 31 has an annular shape and includes a mounting surface 31A and a plurality of clamps 31B. The annular frame 7 is mounted on the mounting surface 31A. The clamps 31B hold the annular frame 7. The elevation unit 32 is provided below the frame holding table 31 and raises and lowers the frame holding table 31. The elevation unit 32 includes a plurality of air cylinders 32A. A piston rod 32B of each air cylinder 32A is coupled to a lower surface of the frame holding table 31. By expanding and contracting the piston rod 32B, the elevation unit 32 moves the mounting surface 31A of the frame holding table 31 between a reference position and an expansion position in the vertical direction. The reference position is substantially the same height as an upper end 33A of the tape expansion drum 33. The expansion position is lower than the upper end 33A by a predetermined amount.

The tape expansion drum 33 has a cylindrical shape and is provided on an inner side of the frame holding table 31 having an annular shape. The tape expansion drum 33 has an inner diameter and an outer diameter that are larger than those of the wafer 2 of the workpiece unit 1 and smaller than the opening 7A of the annular frame 7. With this configuration, the upper end 33A of the tape expansion drum 33 contacts the tape 6 between the wafer 2 and the annular frame 7 in the workpiece unit 1. For example, the imaging unit 34 is a camera which is provided inside the tape expansion drum 33 and mainly images the tape 6 from a lower surface side of the workpiece unit 1. Since the captured image is displayed on a display apparatus such as a color monitor, not illustrated, the worker can check the color of the tape 6.

When the wafer 2 is divided, the workpiece unit 1 is held on the frame holding table 31 of the expansion apparatus 30 as illustrated in FIG. 4. Specifically, the annular frame 7 is mounted on the mounting surface 31A of the frame holding table 31 and held by the clamps 31B. At this time, the piston rod 32B of the elevation unit 32 expands such the mounting surface 31A of the frame holding table 31 is positioned at the reference position which is substantially the same height as the upper end 33A of the tape expansion drum 33.

Next, cool air is supplied from the cool air supply port to cool the inside of the cooling chamber 50 to the desired temperature. Accordingly, the workpiece unit 1 (tape 6) in the cooling chamber 50 is cooled to the desired temperature. In the present embodiment, the tape 6 of the workpiece unit 1 includes the first thermochromic ink and the second thermochromic ink. Specifically, in response to a change in temperature (external stimulus), the first thermochromic ink changes in color to the first color at the predetermined first temperature, while the second thermochromic ink changes in color to the second color at the predetermined second temperature that is lower than the first temperature. It is known that when ductile elements such as the TEG 8 provided on the planned division lines 3 of the wafer 2 are cooled to a temperature lower than a predetermined reference temperature (e.g., −80° C.), the ductility of the ductile elements decreases and the ductile elements can be efficiently divided. Since this reference temperature varies depending on the type, material, size, or the like of the ductile elements, the reference temperature is set based on, for example, an experiment which is carried out in advance. In the present embodiment, the second temperature (e.g., −100° C.) is set to a temperature lower than the reference temperature (−80° C.), while the first temperature (e.g., 0° C.) is set to a temperature higher than the reference temperature.

With this configuration, the worker can easily determine, from the appearance of the tape 6, whether the workpiece unit 1 (TEG 8) has been cooled to the reference temperature or lower by checking whether the tape 6 has changed in color and how large the region changed in color is. Specifically, as illustrated in FIG. 6, an outer edge 65A of a region 65 has changed in color to the second color. When the outer edge 65A has reached an outer side of an outer peripheral portion of the wafer 2 (the outer edge 65A has reached the outer peripheral edge 61 of the tape 6 in FIG. 6), the worker can determine that at least the wafer 2 on which the TEG 8 (FIG. 1) is provided has been cooled to the second temperature or lower. Therefore, as illustrated in FIG. 5, the piston rod 32B of the elevation unit 32 is contracted to lower the mounting surface 31A of the frame holding table 31 to the expansion position. At this time, since the annular frame 7 fixed to the mounting surface 31A of the frame holding table 31 is also lowered, the tape 6 attached to the annular frame 7 is expanded in contact with the upper end 33A of the tape expansion drum 33. As a result, a tensile force acts radially on the wafer 2 attached to the tape 6. This divides the wafer 2 into individual device chips 11 along the modified layers 9 (FIG. 4) formed on the respective planned division lines 3. At this time, since the TEG 8 on the planned division lines 3 has been cooled to the second temperature or lower and the ductility has decreased, the TEG 8 can be reliably divided together with the wafer 2.

As illustrated in FIG. 7, a region 66 has changed in color to the first color. When the region 66 is present on an inner side of the wafer 2, the worker can determine that part of the TEG 8 has not been sufficiently cooled yet and a division failure may occur since the entire wafer 2 has not been cooled to the second temperature or lower. Therefore, when cooling is not sufficient, cooling is continued until at least the outer edge 65A of the region 65, which has changed in color to the second color, reaches the outer side of the outer peripheral portion of the wafer 2. Accordingly, the division failure can be prevented.

According to the embodiment of the present invention, in response to a change in temperature (external stimulus), the tape 6 of the workpiece unit 1 reversibly changes in color to the first color at the predetermined first temperature, and reversibly changes in color to the second color at the predetermined second temperature that is lower than the first temperature. With this configuration, the worker can easily determine, from the appearance of the tape 6, whether the process involving the external stimulus has been performed.

The present invention is not limited to the above-described embodiment. That is, various modifications can be made without departing from the scope of the present invention. In the present embodiment, for example, the workpiece unit 1 includes, as the ductile elements, the TEG 8 provided on the planned division lines 3 of the wafer 2. However, the ductile elements are not limited to the TEG 8. For example, the workpiece unit 1 may include, as a ductile element, a die attach film (DAF) attached between the wafer 2 and the tape 6. The DAF is an adhesive sheet for die bonding and is larger than the wafer 2. Therefore, for example, when the outer edge 65A of the region 65, which has changed in color to the second color, has reached an outer side of an outer peripheral portion of the DAF, the worker can determine that at least the DAF has been cooled to the second temperature or lower. In contrast, when the region 66, which has changed in color to the first color, is present on an inner side of the DAF, the worker can determine that the entire DAF has not been cooled to the second temperature or lower and the DAF may fail to be divided.

In the present embodiment, the tape 6 includes the first thermochromic ink and the second thermochromic ink. The first thermochromic ink changes in color at the first temperature that is higher than the reference temperature at which the ductility of the TEG 8 as the ductile elements decreases. The second thermochromic ink changes in color at the second temperature that is lower than the first temperature and the reference temperature. Alternatively, the tape 6 may include single thermochromic ink that changes in color at the second temperature. With this configuration, the worker can determine whether a cooling target region has been cooled to the second temperature or lower.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A workpiece unit including a workpiece, a tape that is attached to the workpiece, and an annular frame to which an outer peripheral edge of the tape is attached and having an opening in a center of the annular frame, the workpiece unit having the workpiece positioned in the opening of the annular frame through the tape, said tape including a color change layer made of a first ink and a second ink, wherein the first ink changes to a first color at a first temperature and the second ink changes color at a second temperature, said first temperature is different from said second temperature, wherein the first ink and the second ink of said tape each reversibly change in color in response to an external stimulus.

2. The workpiece unit according to claim 1, wherein the external stimulus includes a decrease in temperature.

3. The workpiece unit according to claim 1, wherein the first ink and the second ink are dispersed over an entire area of the color change layer.

4. The workpiece unit according to claim 3, further comprising ductile elements on division lines formed in the workpiece.

5. The workpiece unit according to claim 1, further comprising ductile elements on division lines formed in the workpiece.

6. The workpiece unit according to claim 1, wherein said first color and said second color are different.

* * * * *